United States Patent [19]

Martin et al.

[11] Patent Number: 5,075,654
[45] Date of Patent: Dec. 24, 1991

[54] RESONATOR TUNING ARRANGEMENT

[75] Inventors: Siegbert Martin, Backnang; Sigmund Lenz, Aspach; Erich Pivit, Allmersbach i. T., all of Fed. Rep. of Germany; Robert P. Russell, Darnestown, Md.

[73] Assignee: Ant Nachrichtentechnik GmbH, Backnang, Fed. Rep. of Germany

[21] Appl. No.: 619,415

[22] Filed: Nov. 29, 1990

[30] Foreign Application Priority Data

Nov. 29, 1989 [DE] Fed. Rep. of Germany ....... 3939409

[51] Int. Cl.$^5$ .......................... H01P 7/06; H03J 3/16
[52] U.S. Cl. .................................. 333/231; 333/235; 333/263; 315/39.55; 334/4
[58] Field of Search .............. 333/202, 205, 231, 233, 333/235, 238, 158, 263, 219.2; 315/5.41, 5.46, 39.55, 39.59; 334/4, 11, 41

[56] References Cited

U.S. PATENT DOCUMENTS 3,333,148  7/1967  Buck .............................. 333/232 X
3,886,471  5/1975  Massani et al. ................. 333/231 X
4,251,786  2/1981  Goldie et al. .................... 333/219.2

OTHER PUBLICATIONS

R. M. Hutcheon, "A Perpendicular-Biased Ferrite Tuner for the 52 MHz Petra II Cavities", published in *IEEE Particle Accelerator Conference*, vol. 3, 1987, No. 3, pp. 1543-1545.

*Primary Examiner*—Eugene R. LaRoche
*Assistant Examiner*—Seung Ham
*Attorney, Agent, or Firm*—Spencer & Frank

[57] ABSTRACT

A ferrite tuning arrangement for a resonator includes a ferrite loaded line in the form of a stripline having an inner conductor, an outer conductor and a ferrite disposed between the inner and outer conductors, with the stripline being adapted for coupling to the resonator. A reflecting termination is provided for the stripline and a magnetic circuit is provided for generating a variable premagnetization field for the ferrite in an orientation perpendicular to a high frequency magnetic field existing in the stripline.

4 Claims, 1 Drawing Sheet

RESONATOR TUNING ARRANGEMENT

CROSS REFERENCE TO RELATED APPLICATION

The present application claims the rights of priority of application Ser. No. P 39 39 409.3 filed Nov. 29th, 1989 in the Federal Republic of Germany, the subject matter of which is incorporated herein by reference.

BACKGROUND OF THE INVENTION

The present invention relates to a resonator tuning arrangement which includes a ferrite loaded line coupled to a cavity resonator and means for generating a variable premagnetization field for the ferrite in an orientation perpendicular to a high frequency magnetic field existing in the line.

Such a ferrite tuning device for a cavity resonator of a particle accelerator or a synchrotron storage ring is disclosed, for example, by R. M. Hutcheon in an article, entitled "A Perpendicular-Biased Ferrite Tuner For The 52 MHz Petra II Cavities", published in *IEEE Particle Accelerator Conference*, Volume 3, 1987, No. 3, pages 1543-1545. This tuning device is configured as a coaxial line in which at least one ferrite ring is arranged coaxially in the inner conductor. An annular coil surrounding the outer conductor generates the variable premagnetization field for the ferrite. From a manufacturing point of view, annular ferrites are expensive. Moreover, it is difficult to cool such ferrite rings since thermal contact can be made only at their outer or inner circumference or by means of intermediate ceramic rings (BeO) having a high thermal conductivity. Due to greatly differing coefficients of thermal expansion between ferrite, ceramic and metal, there exists the danger that the ferrite rings will burst. The tuning effect of a ferrite loaded line is based on the fact that its propagation constant is a function of the permeability of the ferrite. The permeability of the ferrite can be changed by a premagnetization field. If now such a tunable line is coupled to a resonator, it is possible to change the resonant frequency of the latter in the desired manner.

If, for example, the resonator is a tunable cavity resonator as it is employed in a particle accelerator or a synchrotron storage ring, the high quality of such a resonator demands an extremely low-loss tuning arrangement. As is evident from the above cited literature, the ferrite in the line is subjected to a premagnetization field which is oriented perpendicularly to the high frequency magnetic field in the line. According to the cited prior art, the premagnetization field is directed axially to the coaxial inner conductor. In order to permit all of the ferrite disposed in the coaxial line to be penetrated only by that component of the premagnetization field which is oriented perpendicularly to the high frequency magnetic field, the coil generating the premagnetization field must extend much further in the axial direction of the line than the ferrite. To thus create a low-loss tuning arrangement, a rather voluminous electromagnet must be employed.

SUMMARY OF THE INVENTION

It is an object of the present invention to provide a tuning arrangement of the above-mentioned type which is a low-loss arrangement and can be realized with the lowest possible manufacturing costs.

The above and other objects of the invention are accomplished by the provision of a ferrite tuning arrangement for a resonator, including: a ferrite loaded line in the form of a stripline having an inner conductor, an outer conductor and a ferrite disposed between the inner conductor and the outer conductor; means for coupling the stripline to a resonator; means defining a reflecting termination for the stripline; and means for generating a variable premagnetization field for the ferrite in an orientation perpendicular to a high frequency magnetic field existing in the stripline.

Since, according to the invention, a stripline is employed as the tuning arrangement, the manufacturing costs for the ferrite elements are lower than in the prior art as a result of the fact that planar ferrite elements can be employed to cover the planar inner conductor and/or the planar outer conductor of the stripline.

The heat generated in the ferrite can also be dissipated effectively and easily in that cooling channels can be provided in the inner and/or outer conductor according to a further aspect of the invention. Temperature dependent changes in volume of the stripline have no adverse effect on the planar ferrite elements fixed to the inner conductor and/or to the interior of the outer conductor. The stripline additionally permits the use of a premagnetization device which generates only a small stray field, thus providing for a very low-loss, homogeneous magnetization of the ferrite. A magnetic circuit can be produced at low expense around the exterior of the stripline. Since the stripline constitutes only a relatively small air gap for the premagnetization of the ferrite, the power requirement for it is not very high.

The invention will now be described in greater detail with reference to an embodiment thereof that is illustrated in the drawings.

DESCRIPTION OF THE PREFERRED EMBODIMENTS

Figure 1:
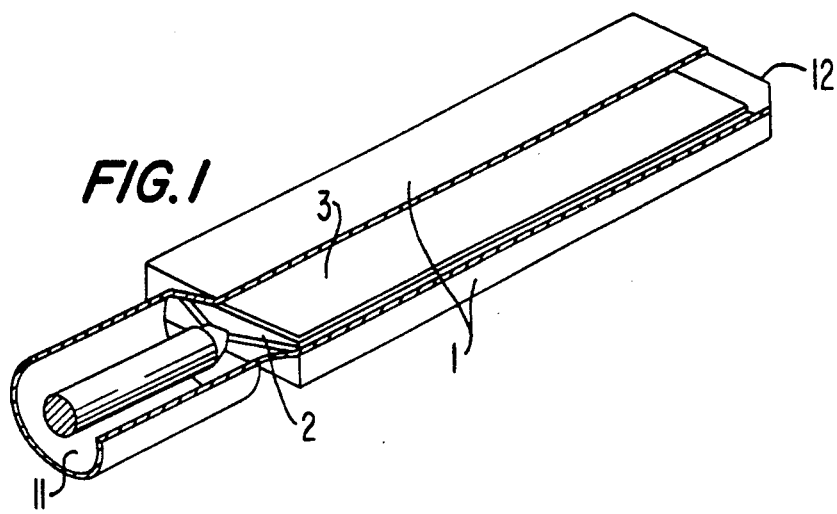
FIG. 1 is a perspective representation of a ferrite loaded stripline.
Figure 2A:
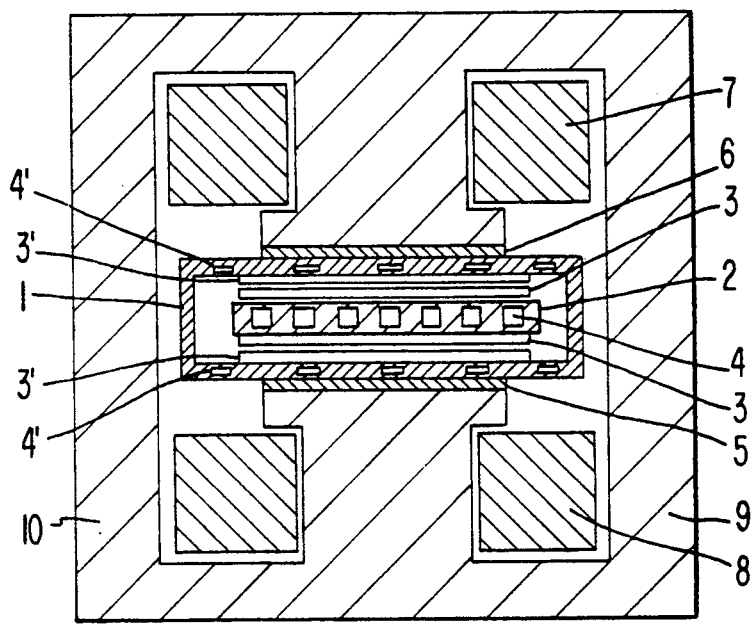
FIG. 2 is a cross-sectional view of a stripline equipped with a premagnetization device.

A stripline as schematically shown in FIG. 1 in a partially cut-open perspective view and in a more detailed cross-sectional view in FIG. 2 is employed as a tuning arrangement, for example, for the cavity resonator of a particle accelerator or a synchrotron storage ring.

The stripline of this embodiment is symmetrical and is composed of a closed outer conductor 1 and a planar inner conductor 2 disposed therein. The stripline is provided with a highly reflective termination 12 (e.g. a short circuit). FIGS. 1 and 2 show that both sides of the inner conductor 2 of the stripline are covered with ferrite 3. The ferrite is composed, for example, of several ferrite disks which are glued onto inner conductor 2. It is also possible, as also shown in FIG. 2, to cover the facing interior faces (broadsides) of outer conductor 1 with ferrite 3' or of both the inner and outer conductors of the stripline with ferrite 3 and 3'. The heat generated in ferrite 3, 3' can be dissipated very effectively and easily with the aid of cooling channels, 4 which penetrate inner conductor 2 and/or cooling channels 4' which penetrate outer conductor 1.

Figure 3:
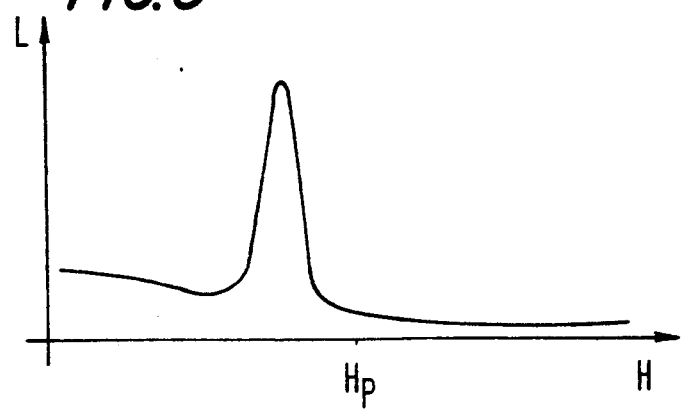
FIG. 3 is a diagram showing the power loss in the ferrite as a function of the premagnetization field.

The ferrite 3, 3', disposed either on the outer surface of inner conductor 2 and/or on the inner surface of outer conductor 1, is subjected to a premagnetization field oriented perpendicularly to the high frequency magnetic field propagating in the stripline. For this purpose, a permanent magnet is provided, as shown in FIG. 2, between whose two poles 5 and 6 the stripline is arranged so that the magnetic field existing between poles 5 and 6 is perpendicular to the ferrite 3, 3' covered planes of inner conductor 2 and/or outer conductor 1. This permanent magnet generates such a high static magnetic field $H_p$, that the ferrite 3, 3' is operated above its gyromagnetic resonance. The dependency of the magnetic power loss L in the ferrite, shown in FIG. 3 as a function of the applied magnetic field H, indicates that above the gyromagnetic resonance the power loss decreases with increasing magnetic field. The tuning arrangement is to be operated in this low-loss region. A variable magnetic field superposed on the static magnetic field $H_p$ permits tuning of the ferrite loaded stripline to the desired phase of the input reflection coefficient of the line. This variable magnetic field is generated by an electromagnet composed, according to FIG. 2, of two coils 7 and 8 that are wound around the two poles 5 and 6, respectively. The use of a permanent magnet and an electromagnet has the advantage that only small currents are required to tune the ferrite loaded stripline since, thanks to the permanent magnet, only part of the required magnetization need be furnished by the electromagnet. It is also of advantage that, should the control current for the electromagnet possibly fail, the power loss L in the ferrite does not increase very much because the permanent magnet always keeps the ferrite magnetization above gyromagnetic resonance.

The stray field of the described magnetization arrangement can be kept very small in that, as shown in FIG. 2, a magnetic circuit is established from one pole 5 to the other pole 6. The magnetic circuit is realized by two symmetrically arranged yokes 9 and 10 which extend around the narrow sides of the stripline.

The above-described stripline is coupled in a known manner, for example by way of a coaxial line 11 (FIG. 1) to the respective cavity resonator to be tuned.

The dimensions of the stripline depend on the required tuning range. For example, the length of the line may be about 1 m if, at an operating frequency of 50 MHz, the phase of the input reflection factor of the line is to be tunable between 0° and 90°. For this case, the inner conductor has a width of 170 mm and a thickness of 15 mm, the outer conductor has an interior width of 200 mm and an interior height of 60 mm. The wall thickness of the outer conductor at its broadsides perpendicular to the premagnetization field is 3 mm and the ferrite covering the inner or outer conductor has a thickness of 7.5 mm and a width of 160 mm. For a ferrite having a saturation magnetization $4\pi M_s$ of about 1000 G, there is a maximum attenuation of about 0.04 dB if the phase of the input reflection factor is tuned to about 90°.

The tuning arrangement involved here can be operated at high frequency power up to 300 kW and has a dielectric strength of about 15 kV. A possible ferrite material is polycrystalline yttrium-iron garnet. For example, the inner and outer conductor can be made of brass or stainless steel.

The value for the static magnetic field is about 0.086 T. The variable superimposed magnetic field changes the resulting field from 0.086 T to 0.22 T.

Obviously, numerous and additional modifications and variations of the present invention are possible in light of the above teachings. It is therefore to be understood that within the scope of the appended claims, the invention may be practiced otherwise than as specifically claimed.

What is claimed is:

1. A ferrite tuning arrangement for a resonator, comprising:
   a ferrite loaded line in the form of a stripline having an inner conductor, an outer conductor and a ferrite disposed between said inner conductor and said outer conductor;
   means for coupling said stripline to a resonator;
   means defining a reflecting termination for said stripline; and
   means for generating a variable premagnetization field for said ferrite in an orientation perpendicular to a high frequency magnetic field existing in said stripline.

2. An arrangement as defined in claim 1, wherein said outer conductor has an inner surface and said inner conductor has an outer surface and said ferrite covers at least one of the said outer surface and said inner surface.

3. An arrangement as defined in claim 1, wherein said means for premagnetizing the ferrite comprises permanent magnetic means for generating a static magnetic field that operates the ferrite above its gyromagnetic resonance and electromagnetic means for generating a variable magnetic field which is superposed on the static magnetic field of said permanent magnetic means.

4. An arrangement as defined in claim 1, wherein at least one of said inner and outer conductors includes cooling channels.

* * * * *